(12) United States Patent
Wu et al.

(10) Patent No.: US 10,664,112 B2
(45) Date of Patent: May 26, 2020

(54) METHOD OF MANUFACTURING A TOUCH MODULE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Shouzheng Wu, Beijing (CN); Qing Zhang, Beijing (CN); Jun Xu, Beijing (CN); Fusheng Huang, Beijing (CN); Heng Zhang, Beijing (CN); Ji Shao, Beijing (CN); Dapeng Liu, Beijing (CN); Zhigang Ouyang, Beijing (CN); Baoqing Yin, Beijing (CN); Xiaojun Wang, Beijing (CN); Tongmin Liu, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

(*) Notice: Subject to any disclaimer, the term of this patent is extended or adjusted under 35 U.S.C. 154(b) by 4 days.

(21) Appl. No.: 16/002,694

(22) Filed: Jun. 7, 2018

(65) Prior Publication Data

US 2019/0204947 A1    Jul. 4, 2019

(30) Foreign Application Priority Data

Jan. 3, 2018 (CN) .......................... 2018 1 0005967

(51) Int. Cl.
*H05K 3/02* (2006.01)
*G06F 3/044* (2006.01)
(Continued)

(52) U.S. Cl.
CPC ............ *G06F 3/044* (2013.01); *G06F 3/0443* (2019.05); *G06F 3/0446* (2019.05);
(Continued)

(58) Field of Classification Search
CPC ........... G06F 2203/04103; G06F 3/041; G06F 2203/04111; G06F 3/04164; G06F 3/0445;
(Continued)

(56) References Cited

U.S. PATENT DOCUMENTS 9,612,694 B2* 4/2017 Tung ....................... G06F 3/044
10,013,120 B2* 7/2018 Misaki .................... G06F 3/044
(Continued)

FOREIGN PATENT DOCUMENTS

CN          103455204 B      8/2016

*Primary Examiner* — Thiem D Phan (57) ABSTRACT

A touch module and a manufacturing method thereof, and a touch screen are provided. The method of manufacturing a touch module includes: forming a composite electrode, a lead, and a lead pad each of which has a stacked structure of a transparent conductive layer and a metal layer on a substrate by one patterning process, the touch module including a touch area, and a peripheral area and a bonding area located at the periphery of the touch area, the composite electrode being formed in the touch area, the lead being formed in the peripheral area, and the lead pad being formed in the bonding area; forming a protective layer outside the touch area, and etching away the metal layer of the composite electrode to form a transparent touch electrode.

8 Claims, 6 Drawing Sheets

(51) Int. Cl.
*G06F 3/041* (2006.01)
*H05K 3/06* (2006.01)
(52) U.S. Cl.
CPC ........ *G06F 3/04164* (2019.05); *G06F 3/0448* (2019.05); *G06F 2203/04103* (2013.01); *G06F 2203/04111* (2013.01); *H05K 3/067* (2013.01); *Y10T 29/49156* (2015.01)
(58) Field of Classification Search
CPC .......... G06F 3/0488; H05K 2201/0108; H05K 2201/10128; H05K 3/4685; Y10T 29/49002; Y10T 29/49117; Y10T 29/49156; B32B 2457/208; B32B 2307/412; B32B 15/04
USPC ........................... 29/847, 825, 829, 846, 849
See application file for complete search history.

(56) References Cited

U.S. PATENT DOCUMENTS

| | | | |
|---|---|---|---|
| 10,372,249 B2 * | 8/2019 | Liu | ................. H01L 27/323 |
| 2015/0062454 A1 | 3/2015 | Hao et al. | |

\* cited by examiner

S1 — forming a composite electrode, a lead, and a lead pad each of which has a stacked structure of a transparent conductive layer and a metal layer on a substrate by one patterning process;

S2 — forming a protective layer outside the visible area, and etching the metal layer of the composite electrode.

METHOD OF MANUFACTURING A TOUCH MODULE

The application claims priority of the Chinese patent application No. 201810005967.7, filed on Jan. 3, 2018, the entire disclosure of which is incorporated herein by reference as part of the present application.

TECHNICAL FIELD

The present disclosure relates to a touch module, a manufacturing method thereof, and a touch screen.

BACKGROUND

With the rapid development of display technology, touch screens have been gradually and widely used in people's lives. According to the operation principle, the touch screens can be divided into the following types: a capacitive type, a resistive type, an infrared type, a surface acoustic wave type, an electromagnetic type, a vibration wave sensing type and a frustrated total internal reflection optical sensing type and the like. The capacitive touch screen has the advantages of high sensitivity, long life, high light transmittance, and the like. The capacitive touch screens can be further divided into a glass-glass (G-G) type and a single glass (OGS) type. The G-G type is to fabricate a sensor module on a normal glass and then attach it to a protective glass. The G-G type has the advantage that the manufacturing process is simple, but the disadvantages of it are a larger thickness, a lower transmittance and the like. The OGS type is to fabricate a sensor module directly on a tempered glass, which has the advantages of a simple structure, a thin thickness, a high transmittance and the like, and gradually becomes a mainstream technology. At present, the OGS type touch module occupies more than 60% of the market for the touch screens.

SUMMARY

Some embodiments of the disclosure provide a method of manufacturing a touch module, comprising: forming a composite electrode, a lead, and a lead pad each of which has a stacked structure of a transparent conductive layer and a metal layer on a substrate by one patterning process, the touch module comprising a touch area, and a peripheral area and a bonding area located at the periphery of the touch area, the composite electrode being formed in the touch area, the lead being formed in the peripheral area, and the lead pad being formed in the bonding area; forming a protective layer outside the touch area, and etching the metal layer of the composite electrode to form a transparent touch electrode.

In some examples, the method further comprises: before forming the composite electrode, the lead, and the lead pad, forming a bridge layer and a bridge protective layer in the touch area, wherein the bridge protective layer is located on the bridge layer.

In some examples, the bridge protective layer covers a middle part of the bridge layer and exposes both ends of the bridge layer.

In some examples, forming the composite electrode, the lead and the lead pad each of which has the stacked structure of the transparent conductive layer and the metal layer on the substrate by the one patterning process comprises: depositing a transparent conductive film and a metal film in sequence, and forming the composite electrode in the touch area, forming the lead in the peripheral area, and forming the lead pad in the bonding area by the one patterning process.

In some examples, the touch electrode comprises a plurality of first electrode rows and a plurality of second electrode columns which are intersected with and insulated from each other, and each of the first electrode rows has an integral structure, each of the second electrode columns comprises a plurality of second electrodes which are separated from each other with adjacent second electrodes being connected by the bridge layer; or each of the second electrode columns has an integral structure, and each of the first electrode rows comprises a plurality of first electrodes which are separated from each other with adjacent first electrodes being connected by the bridge layer.

In some examples, forming the protective layer outside the touch area, and etching the metal layer of the composite electrode to form the transparent touch electrode comprising: forming a first protective layer to cover the entire substrate, and forming a second protective layer at the peripheral area to cover the lead; etching the first protective layer and the metal layer in the touch area by a first etching process, to form a transparent touch electrode in the touch area; etching the first protective layer in the bonding area by a second etching process.

In some examples, forming the protective layer outside the touch area, and etching the metal layer of the composite electrode to form the transparent touch electrode comprising: forming a first protective layer in the peripheral area and the bonding area to cover the lead and the lead pad; forming a second protective layer in the peripheral area to cover the lead; etching the metal layer in the touch area by a first etching process to form the transparent touch electrode; etching the first protective layer in the bonding area by a second etching process.

In some examples, forming the protective layer outside the touch area, and etching the metal layer of the composite electrode to form the transparent touch electrode comprising: forming a first protective layer in the peripheral area and the bonding area to cover the lead and the lead pad; etching the metal layer in the touch area by a first etching process to form the transparent touch electrode in the touch area; etching the first protective layer in the peripheral area and the bonding area by a second etching process; forming a second protective layer in the peripheral area to cover the lead.

Some embodiments of the disclosure provide a touch module, comprising: a substrate, comprising a touch area, and a peripheral area and a bonding area located at the periphery of the touch area; a transparent touch electrode, located in the touch area; a lead, located in the peripheral area; a lead pad, located in the bonding area, wherein the touch electrode is made of a transparent conductive layer, and the lead and the lead pad are of a stacked structure of the transparent conductive layer and a metal layer.

In some examples, the transparent conductive layer of the lead and the lead pad are integrally formed with at least a portion of the transparent conductive layer of the touch electrode.

In some examples, the touch module further comprises: a bridge layer and a bridge protective layer between the touch electrode and the substrate, and the bridge protective layer covers a middle part of the bridge layer and exposes both ends of the bridge layer.

In some examples, the touch electrode comprises a plurality of first electrode rows and a plurality of second electrode columns which are intersected with and insulated from each other, and each of the first electrode rows has an integral structure, each of the second electrode columns comprises a plurality of second electrodes which are separated from each other with adjacent second electrodes being connected by the bridge layer; or each of the second electrode columns has an integral structure, and each of the first electrode rows comprises a plurality of first electrodes which are separated from each other witch adjacent first electrodes being connected by the bridge layer.

In some examples, the first electrode row with the integral structure or the second electrode column with the integral structure is insulated from the bridge layer by the bridge protective layer.

In some examples, the transparent conductive layer of the lead and the lead pad and the transparent conductive layer of the touch electrode are in a same layer and are made of a same material.

Some embodiments of the disclosure provide a touch screen, comprising the touch module as mentioned above.

BRIEF DESCRIPTION OF THE DRAWINGS

In order to clearly illustrate the technical solution of the embodiments of the disclosure, the drawings of the embodiments will be briefly described in the following. It is obvious that the described drawings are only related to some embodiments of the disclosure and thus are not limitative of the disclosure.

Reference signs: 10—substrate; 20—bridge layer; 30—bridge protective layer; 40—composite electrode; 50—touch electrode; 51—sensing electrode; 52—driving electrode; 60—lead; 70—lead pad; 80—overall protective layer; 90—lead area protective layer; 100—peripheral protective layer.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

The manufacturing process of a conventional OGS type touch module generally comprises: firstly adopting a patterning process to manufacture a pattern of a transparent touch electrode in a visible area (VA), then using another patterning process to manufacture patterns of a metal wiring and a lead pad outside the visible area, and finally fabricate an insulating protective layer.

After study, inventors of the present application have found that the conventional manufacturing process has the disadvantages of low production efficiency, high production cost, unstable quality and the like, which are caused by forming the touch electrodes and the metal wirings respectively by using two patterning processes. For example, after the fabrication of the pattern of the touch electrode is completed, it takes a period of time to start fabricating the pattern of the metal wiring. During this period of time, the pattern of the touch electrode is always exposed, and will continuously contact the air, water vapor, high temperature, and etching liquid, such that the risk of particles in the environment remaining in the pattern of the touch electrode is greatly increased. Once the particles enter into the pattern of touch electrode, defects such as poor exposure, and open circuit or short circuit of the wirings in the subsequent patterning process may occur, and these defects cannot be easily repaired, which will directly lead to the failure of the product function. In addition, the two patterning processes mean that two masks are separately used for the exposure processes, and there is a problem of alignment accuracy during the two exposure processes, which not only reduces the production efficiency and increases the production cost, but also has a batch quality risk. If the alignment deviation in the two exposures is too large. it will directly affect the production capacity and yield.

Figure 1:
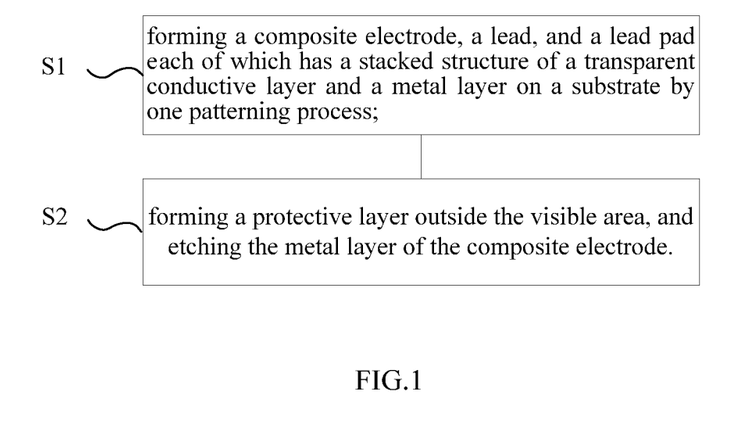
FIG. 1 is a flowchart of a method of manufacturing a touch module according to an embodiment of the present disclosure.

The embodiments of the present disclosure provide a method for manufacturing a touch module, to overcome the defects of low efficiency, high cost, unstable quality and the like in the manufacturing process of prior art. FIG. 1 is a flowchart of a method of manufacturing a touch module according to an embodiment of the present disclosure. As illustrated in FIG. 1, a method of manufacturing a touch module comprises: S1. forming a composite electrode, a lead, and a lead pad each of which has a stacked structure of a transparent conductive layer and a metal layer on a substrate by one patterning process; S2. forming a protective layer outside a visible area and etching the metal layer in the visible area to form a transparent touch electrode. The "visible area" herein is actually the touch area of the touch module. When the touch module and the display panel are combined together, the effective touch area and the visible area of the display panel are substantially coincident. Therefore, this area of the touch module can also be referred to as the visible area.

An embodiment of the present disclosure provides a method of manufacturing a touch module, which processes a transparent conductive layer and a metal layer in a stacked structure by using one patterning process to form a two-layer structure of patterns of a composite electrode, a lead, and a lead pad, and etches the metal layer in the visible area, to form a transparent touch electrode in the visible area. Compared with the technique using two patterning processes, the embodiment of the disclosure not only avoids the opportunity for particles in the environment to contact the touch electrodes, but also avoids the alignment deviation in the two patterning processes, improves the production efficiency, decreases the production time, reduces the production cost, ensures stable quality, and improves the productivity and yield.

The technical solutions of the embodiments of the present disclosure are described in detail below by specific embodiments.

The method of manufacturing the touch module in this embodiment comprises following steps S11-S15.

S11, forming a bridge layer and a bridge protective layer on a substrate, the bridge protective layer being located on the bridge layer.

S12: depositing a transparent conductive layer and a metal layer in sequence, forming a pattern of a composite electrode in a visible area, forming a pattern of a lead in a peripheral area, and forming a pattern of a lead pad in a bonding area by one patterning process; all of the patterns of the composite electrode, the lead and the lead pad are a stacked structure of the transparent conductive layer and the metal layer.

S13: forming a protective layer to cover the entire substrate, and forming a lead area protective layer in the peripheral area to cover the lead;

S14: etching the protective layer and the metal layer in the visible area by a first etching process to form a transparent touch electrode in the visible area.

S15. etching the protective layer in the bonding area by a second etching process.

FIGS. 2-13 are schematic views of manufacturing a touch module according to some embodiments of the present disclosure. The "patterning process" referred to in this embodiment comprises a process of depositing a film layer, coating photoresist, exposing by a mask, developing, etching, stripping the photoresist and the like. Deposition can be performed by the processes such as sputtering, evaporation and chemical vapor deposition.

Figure 2:
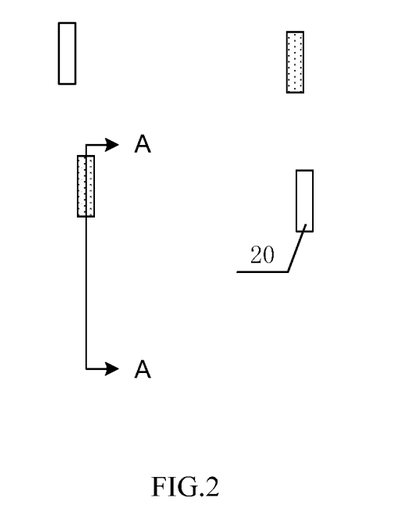
FIG. 2 is a schematic view after a bridge layer pattern is formed, of some embodiments of the present disclosure.
Figure 3:
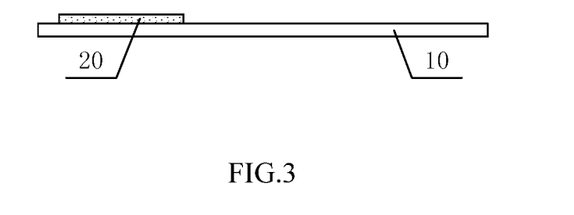
FIG. 3 is a sectional view taken along line A-A in FIG. 2.

A bridge layer pattern is formed on a substrate. Forming the bridge layer pattern comprises depositing a conductive film on the substrate, coating a layer of photoresist on the conductive film, exposing and developing the photoresist using a mask, forming an unexposed area at the position of the pattern of the bridge layer to retain the photoresist and forming a fully exposed area in other positions to remove the photoresist; etching the conductive film in the fully exposed area, stripping the remaining photoresist, and forming a pattern of a bridge layer 20 on the substrate, as illustrated in FIGS. 2 and 3. The substrate can be a glass substrate or a quartz substrate. The conductive film can be made of a metal material or a transparent conductive material such as indium tin oxide (ITO), indium zinc oxide (IZO), carbon nanotubes, or graphene. For example, the ITO can be adopted to increase the transmittance of the touch module, and because the ITO has relative small reflectivity to light compared to metal, the impact of the reflection light on human visual can be reduced.

Figure 4:
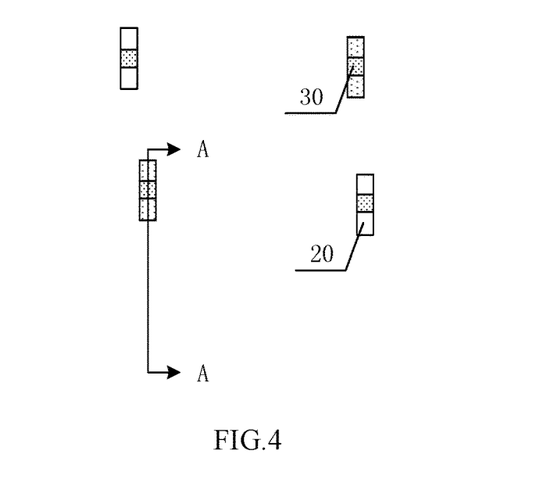
FIG. 4 is a schematic view after a bridge protective layer pattern is formed, of some embodiments of the present disclosure.
Figure 5:
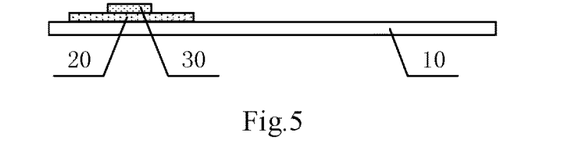
FIG. 5 is a sectional view taken along line A-A in FIG. 4.

A pattern of a bridge protective layer is formed on the substrate on which the pattern of the bridge layer has been formed. Forming the pattern of the bridge protective layer comprises coating a first insulating layer film on the substrate, exposing and developing the first insulating film by using a mask, and forming a pattern of a bridge protective layer 30 on the bridge layer 20, as illustrated in FIGS. 4 and 5. For example, the pattern of the bridge protective layer 30 is located at a middle part of the bridge layer 20, i.e., the bridge protective layer 30 covers a middle area of a surface of the bridge layer 20, to insulate the bridge layer 20 from the subsequently formed sensing electrodes, and two end areas of the surface of the bridge layer 20 are exposed to connect the bridge layer 20 with a subsequently formed driving electrode. The first insulating layer film is also referred as an over coat (OC), which can adopt a material such as organic resin and the like.

Figure 6:
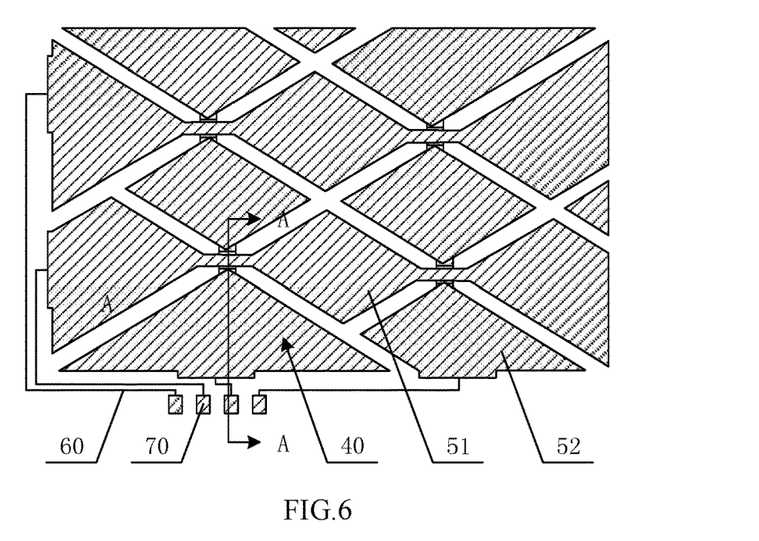
FIG. 6 is a schematic view after patterns of a composite electrode, a lead, and a lead pad are formed, of some embodiments of the present disclosure.
Figure 7:
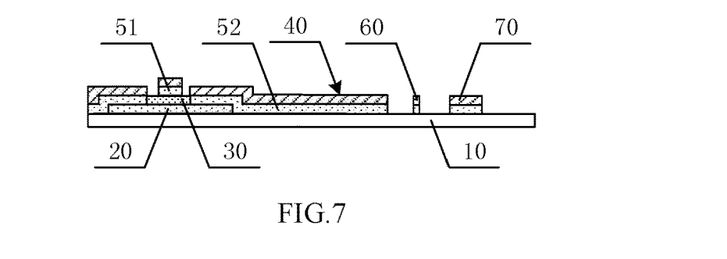
FIG. 7 is a sectional view taken along line A-A in FIG. 6.

Patterns of composite electrode, a lead, and a lead pad are formed on the substrate on which the above mentioned patterns have been formed. Forming the patterns of the composite electrode, the lead and the lead pad comprises: depositing a transparent conductive film and a metal film in sequence on a substrate on which the above mentioned patterns have been formed; coating a layer of photoresist on the metal film; and exposing and developing the photoresist by using a mask; forming an unexposed area at positions of the patterns of the composite electrode, the lead, and the lead pad to retain the photoresist, and forming a fully exposed area at other positions to remove the photoresist; etching the metal film and the transparent conductive film at the fully exposed area and stripping the remaining photoresist to form the patterns of the composite electrodes 40, the lead 60, and the lead pad 70, as illustrated in FIGS. 6 and 7. The patterns of the composite electrode, the lead, and the lead pad are an integral structure of the transparent conductive layer and the metal layer, the pattern of the composite electrode 40 is formed in the visible area, the pattern of the lead 60 is formed in a peripheral area around the visible area, and the pattern of the lead pad is formed in a bonding area. In this embodiment, the lead 60 is disposed on a left side and a lower side of the visible area and is connected to the composite electrode 40, and the leads pad 70 are disposed on the lower side of the visible area and are connected to each of the leads 60. The transparent conductive film can adopt indium tin oxide (ITO) or indium zinc oxide (IZO), the metal film can adopt a metal material with a relatively low resistance, which has a good the conductive effect, to facilitate to improve the touch sensitivity of the touch screen.

In this embodiment, the pattern of the composite electrode 40 formed in the visible area comprises a transparent touch electrode and the metal layer covering the touch electrode. When the composite electrode is formed, a connection between the transparent touch electrode and the bridge layer is also formed at the same time. The touch electrode comprises a sensing electrode 51 and a driving electrode 52 disposed in a same layer, intersected with and insulated from each other, the sensing electrode 51 comprises a plurality of sensing electrode rows, each of the sensing electrode rows has an integral structure including a plurality of diamond sensing electrodes and rectangular connecting electrodes, and adjacent sensing electrodes are connected to each other by connecting electrodes into the integral structure. The driving electrode 52 comprises a plurality of driving electrode columns, each of the driving electrode columns comprises a plurality of diamond driving electrodes which are separated from each other, and adjacent driving electrodes are connected by the bridge layer 20 below them to form the driving electrode column. The bridge protective layer 30 is formed on the bridge layer 20 and the connecting electrode of each of the sensing electrode rows is located on the bridge protective layer 30, so that the bridge layer 20 is insulated from each of the sensing electrode rows. Both end areas of the bridge layer 20 are not covered by the bridge protective layer 30 and each of the driving electrodes is overlapped and contacted with the end area of the bridge layer 20, so that the bridge layer 20 connects driving electrodes that are separated from each other into the driving electrode array. The lead 60 on the left side of the visible area is connected to each of the sensing electrode rows, and the lead 60 on the lower side of the visible area is connected to each of the driving electrode rows. For example, the touch electrodes can also be a driving electrode row and a sensing electrode column that are intersected with and insulated from each other, and this embodiment only illustrates an example in which the bridge layer 20 bridges adjacent driving electrodes.

Figure 8:
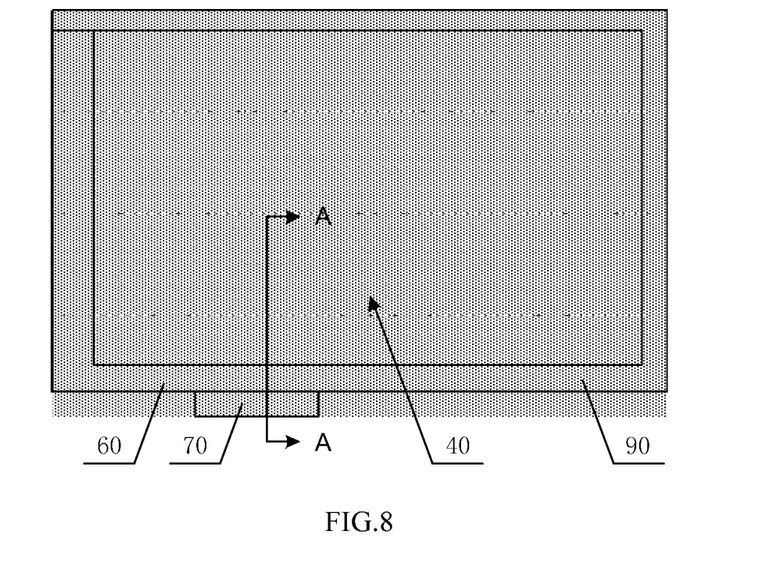
FIG. 8 is a schematic view after a pattern of a protective layer is formed, of some embodiments of the present disclosure.
Figure 9:
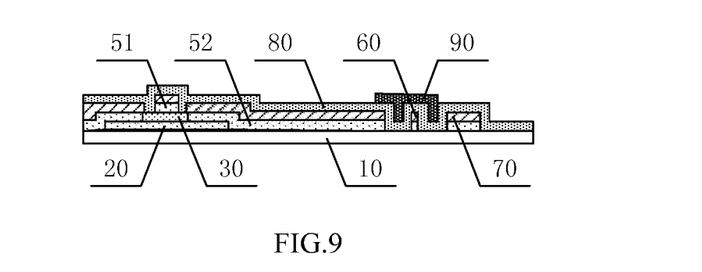
FIG. 9 is a sectional view taken along line A-A in FIG. 8.

A pattern of a protective layer is formed on the substrate on which the above mentioned patterns have been formed. Forming the pattern of the protective layer comprises depositing a second insulating layer on the substrate on which the above mentioned patterns have been formed to form the protective layer 80. Subsequently, a third insulating layer is coated, the third insulating layer is exposed and developed by using a mask, and a pattern of a lead area protective layer 90 is formed in the peripheral area, as illustrated in FIGS. 8 and 9. For example, the protective layer 80 covers the entire substrate, the lead area protective layer 90 only covers the peripheral area, and the lead area protective layer 90 is located on the protective layer 80. That is, the visible area and the bonding area are covered with the overall protective layer 80, and the peripheral area is covered with the overall protective layer 80 and the lead area protective layer 90. The second insulating layer can adopt silicon nitride SiNx, silicon oxide SiOx or silicon oxynitride, or a composite layer of them, and the third insulating layer can adopt an insulating material such as OC.

Figure 10:
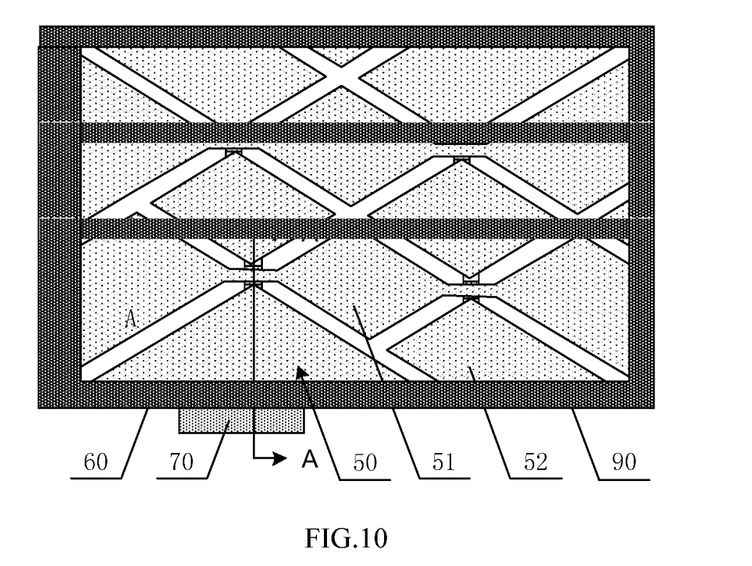
FIG. 10 is a schematic view after a first etching of some embodiments of the present disclosure.
Figure 11:
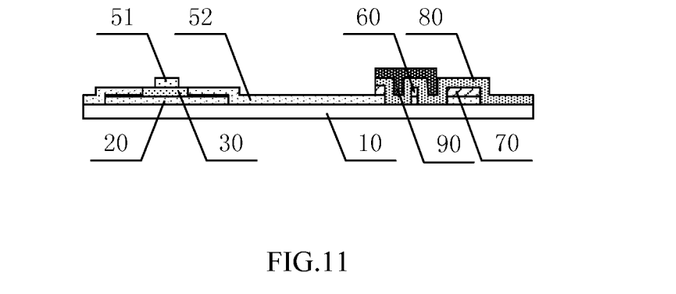
FIG. 11 is a sectional view taken along line A-A in FIG. 10.

The protective layer 80 and the metal layer in the visible area are etched by a first etching process, to sequentially etch the entire protective layer 80 and the metal layer in the visible area, so as to form a transparent touch electrode in the visible area 50, that is, the sensing electrode 51 and the driving electrode 52 formed by the transparent conductive material are exposed, as illustrated in FIGS. 10 and 11. After this process, the bonding area is covered with the protective layer 80, the peripheral area is covered with the protective layer 80 and the lead area protective layer 90, and the lead 60 and the lead pad 70 are still the overall structure of the transparent conductive layer and the metal layer.

Figure 12:
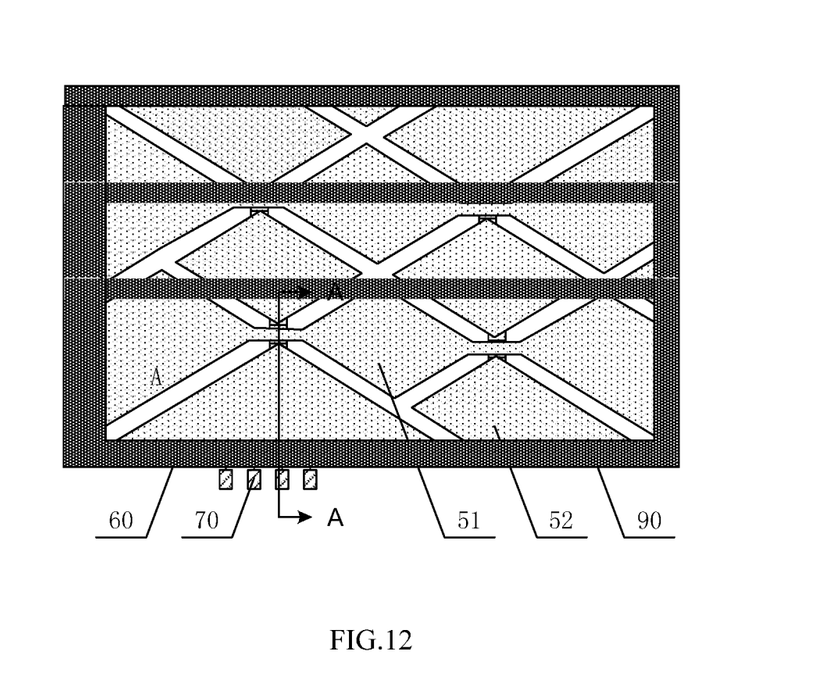
FIG. 12 is a schematic view after a second etching of some embodiments of the present disclosure.
Figure 13:
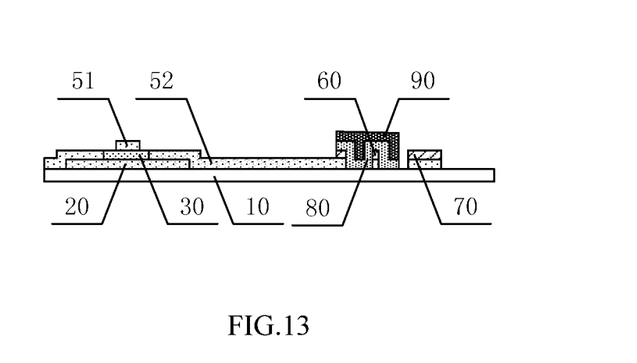
FIG. 13 is a sectional view taken along line A-A in FIG. 12.

The overall protective layer 80 of the bonding area is etched by a second etching process, to etch the protective layer 80 of the bonding area, and expose the lead pad 70 at the bonding area, as illustrated in FIGS. 12 and 13.

As can be seen from the process of manufacturing the touch module illustrated in FIGS. 2-13, in this embodiment, the pattern of the composite electrode with two-layers is formed in the visible area, the pattern of the lead is formed in the peripheral area and the pattern of the lead pad is formed in the bonding area by using a mask at the same time, and the transparent touch electrode is then formed in the visible area by an etching process, so that the technical solution of this embodiment has following features.

(1) Because the metal film is directly deposited after depositing the transparent conductive film, the transparent conductive film has a very short exposure time in the environment, thereby reducing the time of the transparent conductive film contacting with air, water vapor, high temperature, etchant and the like, and reducing the opportunity for particles in the environment to remain on the transparent conductive film, to further reduce the faulty and defects of the subsequent patterning and improve the quality of the product.

(2) Compared with the process using two exposure processes, because the transparent conductive layer and the metal layer are exposed and developed using a mask, the alignment process between the two exposure processes is avoided and the alignment deviation produced by the alignment process is eliminated, which reduces the batch quality risk and increases the yield. At the same time, the use of a mask not only reduces the use of another mask and reduces one time of the exposure, but also eliminates the need for mask change and adjustment. Although one time of etching the metal layer is increased, on the whole, the production time is reduced, the production efficiency is increased, and the production cost is reduced. Further, because the transparent conductive film and the metal film are simultaneously produced, the production of this embodiment can be achieved in both of production lines of the transparent conductive layer and the metal layer of the original production line, which greatly improves the production capacity of the original production line.

(3) Compared with the process of forming the touch electrode and the lead by using two patterning processes respectively, because the touch electrode and the lead are formed by one patterning process in this embodiment, there is no step due to the overlapping and contacting between the touch electrode and the lead, which eliminates the overlapping and contacting defects, improves connection reliability, enhances antistatic capabilities, and improves operation stability.

(4) Because both the lead and the lead pad have a stacked structure of a transparent conductive layer and a metal layer, not only the resistance of the leads can be reduced, but also the scratch resistance of the lead and the lead pad can be improved. Even if the upper metal layer is scratched, the product can still be used normally, provided that the transparent conductive layer is not broken.

In summary, the method of manufacturing the touch module in this embodiment effectively overcomes the defects of low production efficiency, high production cost, and unstable quality in the conventional process. In addition, the technical solution of the present embodiment is applicable to the entire semiconductor manufacturing process and uses the stack of different structural layers to improve the manufacturing process, shorten the manufacturing time, and reduce the manufacturing cost.

As illustrated in FIGS. 12 and 13, embodiments of the present disclosure further provide a touch module. For example, the touch module can be manufactured by the above manufacturing method. The touch module comprises a substrate 10, a bridge layer 20 disposed on the substrate 10; a bridge protective layer 30 disposed on the bridge layer 20, the bridge protective layer 30 being located at a middle part of the bridge layer 20; and a sensing electrode 51 and driving electrode 52 disposed in a same layer and intersected with and insulated from each other, wherein the sensing electrodes 51 comprises a plurality of sensing electrode rows in an integral structure, the driving electrode 52 comprises a plurality of driving electrode columns, each of the driving electrode columns comprises a plurality of driving electrodes, and adjacent driving electrodes are connected by a bridge layer 20; leads 60 having a stacked structure (a transparent conductive layer and a metal layer), and connected to each of the sensing electrode rows and each of the driving electrode columns respectively; and lead pads 70 having a stacked structure (a transparent conductive layer and a metal layer) and connected to each lead 60 respectively.

For example, the above-mentioned touch module can further comprise a protective layer 80 and a lead area protective layer 90 covering the leads 60.

Some embodiments of the present disclosure provide a touch module, comprising a substrate, the substrate comprising a touch area and a peripheral area and a bonding area located around the touch area; a transparent touch electrode, located in the touch area; a lead, located in the area; a lead pad, located in the bonding area, wherein the touch electrode is made of a transparent conductive layer, and the lead and the lead pad have a stacked structure of the transparent conductive layer and a metal layer.

In some examples, the transparent conductive layer of the lead and the lead pad is integrally formed with at least a portion of the transparent conductive layer of the touch electrode.

In some examples, the touch module further comprises a bridge layer and a bridge protective layer between the touch electrode and the substrate, and the bridge protective layer covers a middle part of the bridge layer and exposes two ends of the bridge layer.

In some examples, the touch electrodes comprise a plurality of first electrode rows and a plurality of second electrode columns which are intersected with and insulated from each other, each of the first electrode rows has an integral structure, and each of the second electrode columns comprises a plurality of second electrodes which are separated from each other, and adjacent second electrodes are connected by the bridge layer; or, each of the second electrodes has an integral structure, and each of the first electrode rows comprises a plurality of first electrodes which are separated from each other, and adjacent first electrodes are connected to both ends of the bridge layer.

In some examples, the first electrode row with the integral structure or the second electrode column with the integral structure is insulated from the bridge layer by the bridge protective layer.

In some examples, the transparent conductive layer of the lead and the lead pad, and the transparent conductive layer of the touch electrode are in a same layer and are made of a same material.

The embodiment of the present disclosure provides another method of manufacturing a touch module comprising steps S21-S26.

S21, forming a bridge layer and a bridge protective layer on a substrate, the bridge protective layer being located on the bridge layer.

S22, depositing a transparent conductive layer and a metal layer in sequence, forming a pattern of a composite electrode in a visible area, forming a pattern of a lead in a peripheral area, and forming a pattern of a lead pad in a bonding area by one patterning process; all of the patterns of the composite electrode, the lead, and the lead pad having a stacked structure of a transparent conductive layer and a metal layer.

S23, forming a peripheral protective layer in the peripheral area and the bonding area to cover the lead and the lead pad.

S24, forming a lead area protective layer in the lead area to cover the lead.

S25, etching the metal layer in the visible area by a first etching process, to form a transparent touch electrode in the visible area.

S26. etching the peripheral protective layer in the bonding area by a second etching process.

Figure 14:
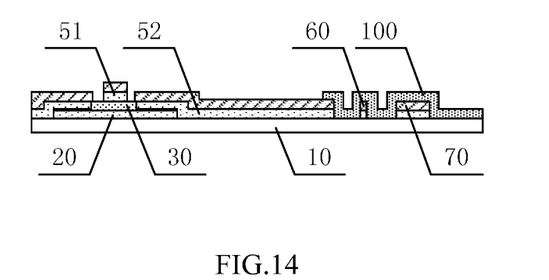
FIG. 14 is a schematic view after a pattern of a peripheral protective layer is formed, of some embodiments of the present disclosure.
Figure 15:
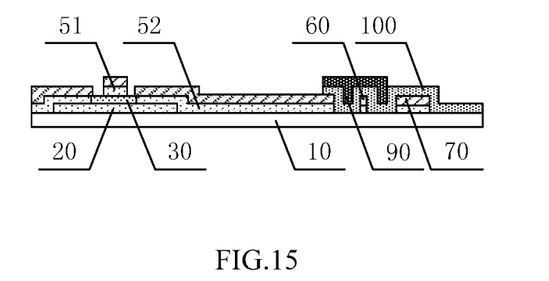
FIG. 15 is a schematic view after a pattern of a lead area protective layer is formed, of some embodiments of the present disclosure.

FIGS. 14 to 15 are schematic views of manufacturing a touch module according to an embodiment of the present disclosure. Different from the embodiment described with reference to FIGS. 2 to 13, the second insulating layer and the metal layer in the visible area of this embodiment are respectively etched in two processes.

For example, the process of manufacturing a touch module in this embodiment comprises following steps.

The first three processes of the this embodiment are the same as the first three processes of the above mentioned embodiments described with reference to FIGS. 2 to 13, firstly forming a pattern of a bridge layer 20 on a substrate, and then forming a pattern of a bridge protective layer 30 on the bridge layer 20, followed by forming patterns of the composite electrode 40, the lead 60, and the lead pad 70 in a stacked structure (a transparent conductive layer and a metal layer), as illustrated in FIGS. 2 to 7.

A pattern of a peripheral protective layer pattern is formed on the substrate on which the above mentioned patterns have been formed. Forming the pattern of the peripheral protective layer comprises: depositing a second insulating layer on the substrate on which the above mentioned patterns have been formed, patterning the second insulating layer by a patterning process, to etch the second insulating layer in the visible area, and retain the second insulating layer in the lead area and the bonding area, so as to form a peripheral protective layer 100, as illustrated in FIG. 14.

A pattern of a lead area protective layer is formed on the substrate on which the above mentioned patterns have been formed. Forming the pattern of the lead area protective layer comprises: coating a third insulating layer on the substrate on which the above mentioned patterns are formed, exposing and developing the third insulating layer, to form a pattern of a lead area protective layer 90 in the peripheral area, as illustrated in FIG. 15. After this process, the bonding area is covered with the peripheral protective layer 100, and the peripheral area is covered with the peripheral protective layer 100 and the lead area protective layer 90.

The metal layer in the visible area is etched by a first etching process, to form a transparent touch electrode in the visible area, and the touch electrode comprises a sensing electrode 51 and a driving electrode 52. After this process, the bonding area is covered with the peripheral protective layer 100, and the peripheral area is covered with the peripheral protective layer 100 and the lead area protective layer 90.

The peripheral protective layer 100 in the bonding area is etched by a second etching process, to expose the lead pad 70 at the bonding area. After this process, the peripheral area is covered with the peripheral protective layer 100 and the lead area protective layer 90.

The structure formed in this embodiment is the same as the embodiment described with reference to FIGS. 2-13. A material of the bridge layer, the bridge protective layer, the touch electrodes, and the lead area protective layer are same as the embodiments described with reference to FIGS. 2-13. The peripheral protective layer can adopt silicon nitride SiNx, silicon oxide SiOx or silicon oxynitride SiON, or a composite layer of them.

The method of manufacturing the touch module in this embodiment has the same technical effects as the embodiments described with reference to FIGS. 2 to 13, and effectively overcomes the defects of low production efficiency, high production cost, and unstable quality in prior art.

An embodiment of the present disclosure provides another method of manufacturing a touch module comprising steps S31-S36.

S31, forming a bridge layer and a bridge protective layer on a substrate, the bridge protective layer being located on the bridge layer.

S32, depositing a transparent conductive layer and a metal layer in sequence, forming a pattern of a composite electrode in a visible area, forming a pattern of a lead in a peripheral area, and forming a pattern of a lead pad in a bonding area by one patterning process; all of the patterns of the composite electrode, the lead, and the lead having a stacked structure of a transparent conductive layer and a metal layer.

S33, forming a peripheral protective layer in the peripheral area and the bonding area to cover the lead and the lead pad.

S34: etching the metal layer in the visible area by a first etching process, to form a transparent touch electrode in the visible area.

S35. etching the peripheral protective layer in the peripheral area and the bonding area by a second etching process.

S36: forming a lead area protective layer in the peripheral area to cover the leads.

FIGS. 16-19 are schematic views of manufacturing a touch module according to an embodiment of the present disclosure. The process of manufacturing the touch module in this embodiment comprises following steps.

The first three processes of the this embodiment are the same as the first three processes of the above mentioned embodiments described with reference to FIGS. 2 to 13, firstly forming a pattern of a bridge layer 20 on a substrate, and then forming a pattern of a bridge protective layer 30 on the bridge layer 20, followed by forming patterns of the composite electrode 40, the lead 60, and the lead pad 70 in a stacked structure (a transparent conductive layer and a metal layer), as illustrated in FIGS. 2 to 7.

Figure 16:
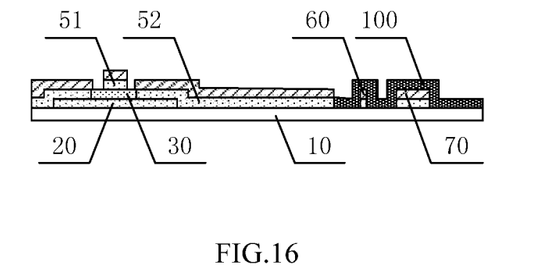
FIG. 16 is a schematic view after a peripheral protective layer is formed, of some embodiments of the disclosure.

A pattern of a peripheral protective layer pattern is formed on the substrate on which the above mentioned patterns have been formed. Forming the pattern of the peripheral protective layer comprises: coating a third insulating layer on the substrate on which the above mentioned patterns are formed, exposing and developing the third insulating layer, to form a pattern of a peripheral protective layer 100 in the peripheral area and the bonding area, as illustrated in FIG. 16. After this process, the peripheral area and the bonding area are both covered with the peripheral protective layer 100.

Figure 17:
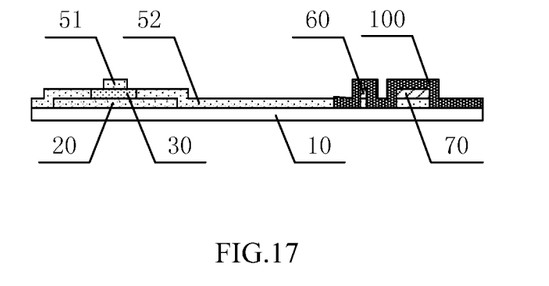
FIG. 17 is a schematic view after the first etching of some embodiments of the disclosure.
Figure 18:
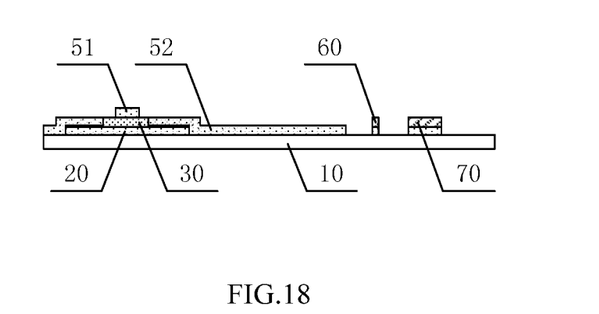
FIG. 18 is a schematic view after the second etching of some embodiments of the present disclosure.

The metal layer in the visible area is etched by a first etching process, to form a transparent touch electrode in the visible area, and the touch electrode comprises a sensing electrode 51 and a driving electrode 52, as illustrated in FIG. 17. Then, the third insulating layer (i.e., the peripheral protective layer 100) of the peripheral area and the bonding area is etched by a second etching process, as illustrated in FIG. 18.

Figure 19:
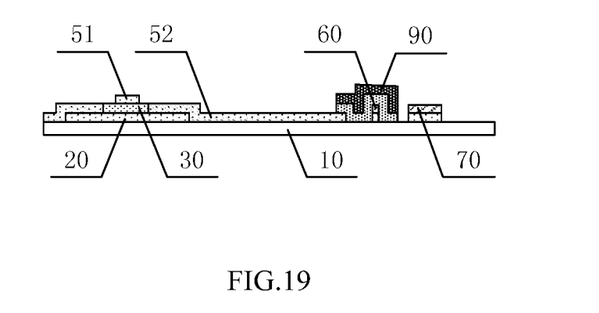
FIG. 19 is a schematic view after a lead area protective layer is formed of some embodiments of the present disclosure.

A pattern of a lead area protective layer is formed on the substrate on which the above mentioned patterns have been formed. Forming the pattern of the lead area protective layer comprises: depositing a second insulating layer on the substrate on which the above mentioned patterns have been formed, then coating a third insulating layer, exposing and developing the third insulating layer, to retain the third insulating layer in the peripheral area and remove the third insulating layer in the visible area and the bonding area, and then etching the second insulating layer in the visible area and the bonding area, to form a pattern of a lead area protective layer 90 in the peripheral area, as illustrated in FIG. 19.

The structure formed in this embodiment is basically the same as that in the above mentioned embodiment, and the material of each structural layer are the same as that in the above mentioned embodiment.

The method of manufacturing the touch module in this embodiment has the same technical effects as those in the above embodiments, and effectively overcomes the defects such as low production efficiency, high production cost, and unstable quality. In this embodiment, although the number of masks for manufacturing the insulating layer is not reduced compared with the processes in the conventional methods, these masks are all general masks which are commonly used. From the overall production of the enterprise, the utilization of the mask is improved, which reduces the overall cost of the enterprise's production.

Based on the inventive concept of the above mentioned embodiments, an embodiment of the present disclosure further provides a touch screen. The touch screen comprises the touch module manufactured by the above mentioned embodiments. The touch screen can be any product or component that has a display function such as a mobile phone, a tablet computer, a television, a monitor, a notebook computer, a digital photo frame, a navigator, and the like.

In the description of the embodiments of the present disclosure, it should be understood that, an orientation or positional relationship indicated by terms "middle", "upper", "lower", "front", "back", "vertical", "horizontal", "top", "bottom", "inner", "outer" and the like are based on the orientation or positional relationship shown in the drawings, in order to just facilitate to describe the present disclosure and simplify the description, but not to indicate or imply that the designated apparatus or component must have a specific orientation, and is constructed and operated in the specific orientation, and thus it should not be construed as limiting the present disclosure.

In the description of the embodiments of the present disclosure, it should be noted that, terms "install", "connect", and "connecting" should be interpreted broadly unless specifically defined or limited otherwise. For example, they can be fixed connections, or can be detachable connections, or integral connections; can be mechanical or electrical connections; can be direct connections, or can be indirect connections by the intermediary, and can be the internal communication between the two components. For those skilled in the art, the specific meanings of the above terms in the present disclosure can be understood in specific circumstances.

What are described above is related to the illustrative embodiments of the disclosure only and not limitative to the scope of the disclosure; the scopes of the disclosure are defined by the accompanying claims.

The invention claimed is:

1. A method of manufacturing a touch module, comprising:

forming a composite electrode, a lead, and a lead pad each of which has a stacked structure of a transparent conductive layer and a metal layer on a substrate by one patterning process, the touch module comprising a touch area, and a peripheral area and a bonding area located at the periphery of the touch area, the composite electrode being formed in the touch area, the lead being formed in the peripheral area, and the lead pad being formed in the bonding area;

forming a protective layer outside the touch area, and etching the metal layer of the composite electrode to form a transparent touch electrode.

2. The method according to claim 1, further comprising: before forming the composite electrode, the lead, and the lead pad, forming a bridge layer and a bridge protective layer in the touch area, wherein the bridge protective layer is located on the bridge layer.

3. The method according to claim 2, wherein the bridge protective layer covers a middle part of the bridge layer and exposes both ends of the bridge layer.

4. The method according to claim 2, wherein the touch electrode comprises a plurality of first electrode rows and a plurality of second electrode columns which are intersected with and insulated from each other, and each of the first electrode rows has an integral structure, each of the second electrode columns comprises a plurality of second electrodes which are separated from each other with adjacent second electrodes being connected by the bridge layer; or each of the second electrode columns has an integral structure, and each of the first electrode rows comprises a plurality of first electrodes which are separated from each other with adjacent first electrodes being connected by the bridge layer.

5. The method according to claim 1, wherein forming the composite electrode, the lead and the lead pad each of which has the stacked structure of the transparent conductive layer and the metal layer on the substrate by the one patterning process comprises:

depositing a transparent conductive film and a metal film in sequence, and forming the composite electrode in the touch area, forming the lead in the peripheral area, and forming the lead pad in the bonding area by the one patterning process.

6. The method according to claim 1, wherein forming the protective layer outside the touch area, and etching the metal layer of the composite electrode to form the transparent touch electrode comprising:

forming a first protective layer to cover the entire substrate, and forming a second protective layer at the peripheral area to cover the lead;

etching the first protective layer and the metal layer in the touch area by a first etching process, to form a transparent touch electrode in the touch area;

etching the first protective layer in the bonding area by a second etching process.

7. The method according to claim 1, wherein forming the protective layer outside the touch area, and etching the metal layer of the composite electrode to form the transparent touch electrode comprising:

forming a first protective layer in the peripheral area and the bonding area to cover the lead and the lead pad;

forming a second protective layer in the peripheral area to cover the lead;

etching the metal layer in the touch area by a first etching process to form the transparent touch electrode;

etching the first protective layer in the bonding area by a second etching process.

8. The method according to claim 1, wherein forming the protective layer outside the touch area, and etching the metal layer of the composite electrode to form the transparent touch electrode comprising:

forming a first protective layer in the peripheral area and the bonding area to cover the lead and the lead pad;

etching the metal layer in the touch area by a first etching process to form the transparent touch electrode in the touch area;

etching the first protective layer in the peripheral area and the bonding area by a second etching process;

forming a second protective layer in the peripheral area to cover the lead.

* * * * *